United States Patent
Feldtkeller (10) Patent No.: US 8,947,064 B2
(45) Date of Patent: Feb. 3, 2015

(54) SYSTEM AND METHOD FOR DRIVING AN ELECTRONIC SWITCH DEPENDENT ON TEMPERATURE

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 542 days.

(21) Appl. No.: 13/237,703

(22) Filed: Sep. 20, 2011

(65) Prior Publication Data
US 2013/0069612 A1    Mar. 21, 2013

(51) Int. Cl.
G05F 1/567    (2006.01)
H03K 17/082    (2006.01)
H02H 5/04    (2006.01)
H03K 17/08    (2006.01)

(52) U.S. Cl.
CPC .......... *H03K 17/0822* (2013.01); *H02H 5/048* (2013.01); *H03K 2017/0806* (2013.01); *Y10S 323/907* (2013.01); *Y10S 323/908* (2013.01)
USPC ........... 323/284; 323/279; 323/285; 323/907; 323/908

(58) Field of Classification Search
USPC ......... 323/273, 277, 279, 284, 285, 907, 908; 315/308, 309, 311; 700/299
See application file for complete search history.

(56) References Cited

U.S. PATENT DOCUMENTS

| | | | |
|---|---|---|---|
| 4,800,331 A * | 1/1989 | Vesce et al. | 323/277 |
| 5,123,081 A * | 6/1992 | Bachman et al. | 388/815 |
| 5,953,222 A | 9/1999 | Mizutani | |
| 6,078,511 A * | 6/2000 | Fasullo et al. | 363/50 |
| 6,184,663 B1 | 2/2001 | Imai et al. | |
| 6,621,678 B2 * | 9/2003 | Wei et al. | 361/103 |
| 7,339,773 B2 | 3/2008 | Gergintschew | |
| 7,538,528 B2 * | 5/2009 | Heath | 323/274 |
| 8,274,291 B2 * | 9/2012 | Tsuchiya | 324/426 |
| 2004/0090726 A1 * | 5/2004 | Ball | 361/93.9 |
| 2008/0212249 A1 * | 9/2008 | Grewe et al. | 361/103 |
| 2008/0284404 A1 * | 11/2008 | Burlak et al. | 323/312 |
| 2009/0262468 A1 * | 10/2009 | Ide et al. | 361/18 |
| 2010/0079920 A1 * | 4/2010 | Fanic | 361/56 |
| 2011/0084616 A1 * | 4/2011 | Negley et al. | 315/154 |
| 2012/0032612 A1 * | 2/2012 | Antony et al. | 315/297 |

FOREIGN PATENT DOCUMENTS

| | | |
|---|---|---|
| CN | 1173068 A | 2/1998 |
| DE | 10245484 A1 | 4/2004 |
| JP | 2000138570 A | 5/2000 |

* cited by examiner

*Primary Examiner* — Fred E Finch, III (74) *Attorney, Agent, or Firm* — Slater & Matsil, L.L.P.

(57) ABSTRACT

An electronic switch is connected in series with a load dependent on an input signal. The electronic switch is operated in a first operation mode for a first time period after a signal level of the input signal has changed from an off-level to an on-level. The first operation mode includes driving the electronic switch dependent on a voltage across the load and dependent on a temperature of the electronic switch. The electronic switch is operated in a second operation mode after the first time period. The second operation mode includes driving the electronic switch dependent on the temperature according to a hysteresis curve.

44 Claims, 4 Drawing Sheets

SYSTEM AND METHOD FOR DRIVING AN ELECTRONIC SWITCH DEPENDENT ON TEMPERATURE

TECHNICAL FIELD

Embodiments of the present invention relate to a method for driving an electronic switch and to an electronic circuit including an electronic switch and a drive circuit.

BACKGROUND

Electronic switches, such as MOSFETs or IGBTs, are widely used for switching electrical loads, such as motors, actors, or lamps in industrial applications. Drive circuits of electronic switches may include an over-current protection circuit and/or an over-temperature protection circuit. An over-current protection circuit is configured to drive the electronic switch such that a current through the switch is limited to a given value. An over-temperature protection circuit switches the switch off when the temperature reaches a given temperature, where the electronic switch may be switched on again when the temperature has fallen below the given temperature.

In particular in industrial applications it is desirable to have an all-purpose electronic switch that can switch different types of loads, such as motors or lamps, in particular incandescent lamps. Incandescent lamps include a filament that has a varying electrical resistance. When the lamp is cold, which means when the filament is cold, the electrical resistance of the filament is significantly lower than when the filament is hot. Thus, within a certain time period after switching on the cold lamp the current through the lamp is significantly higher than later when the filament is hot. When the lamp is switched on using an electronic switch that is over-current and over-temperature protected, the high current shortly after the time of switching on the lamp may cause the drive circuit to limit the current through the electronic switch. This, however, may cause a temperature of the electronic switch to increase to the critical value, so that the electronic switch may be switched off. This could be prevented by increasing the current limiting value. However, limiting the current through the electronic switch to a higher value may increase the risk of the electronic switch to be damaged when connected to a load having a damage, such as a short circuit.

There is, therefore, a need to provide a method for driving an electronic switch that allows an electronic switch to be used for different types of loads, and to provide an electronic circuit with an electronic switch.

SUMMARY OF THE INVENTION

A first embodiment relates to a method for driving an electronic switch connected in series with a load dependent on an input signal. The method includes operating the switch in a first operation mode for a first time period after a signal level of the input signal has changed from an off-level to an on-level, operating the switch in a second operation mode after the first time period. Operating the electronic switch in the first operation mode includes driving the electronic switch dependent on a voltage across the load and dependent on a temperature of the electronic switch, and operating the electronic switch in the second operation mode includes driving the electronic switch dependent on the temperature according to a hysteretic curve.

A second embodiment relates to a method for driving an electronic switch connected in series with a load dependent on an input signal. The method includes operating the electronic switch in a first operation mode for a first time period after a signal level of the input signal has changed from an off-level to an on-level, and operating the electronic switch in a second operation mode after the first time period. Operating the electronic switch in the first operation mode includes switching the electronic switch off when a temperature of the electronic switch reaches a first temperature threshold, and operating the electronic switch in the second operation mode includes driving the electronic switch dependent on the temperature according to a hysteresis curve, so that the electronic switch is switched off when the temperature of the electronic switch reaches a second temperature threshold lower than the first temperature threshold.

A third embodiment relates to an electronic circuit including an electronic switch having a load path configured to have a load connected thereto and a control terminal, and a drive circuit coupled to the control terminal of the electronic switch and configured to receive an input signal. The drive circuit is configured to operate the switch in a first operation mode for a first time period after a signal level of the input signal has changed from an off-level to an on-level, and to operate the switch in a second operation mode after the first time period. Operating the electronic switch in the first operation mode includes driving the electronic switch dependent on a voltage across the load and dependent on a temperature of the electronic switch, and operating the electronic switch in the second operation mode includes driving the electronic switch dependent on the temperature according to a hysteretic curve.

A fourth embodiment relates to an electronic circuit including an electronic switch with a load path configured to have a load connected thereto and a control terminal, and a drive circuit coupled to the control terminal of the electronic switch, and configured to receive an input signal. The drive circuit is further configured to operate the electronic switch in a first operation mode for a first time period after a signal level of the input signal has changed from an off-level to an on-level, and to operate the electronic switch in a second operation mode after the first time period. Operating the electronic switch in the first operation mode includes switching the electronic switch off when a temperature of the electronic switch reaches a first temperature threshold, and operating the electronic switch in the second operation mode includes driving the electronic switch dependent on the temperature according to a hysteresis curve, wherein the electronic switch is switched off when the temperature of the electronic switch reaches a second temperature threshold lower than the first temperature threshold.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
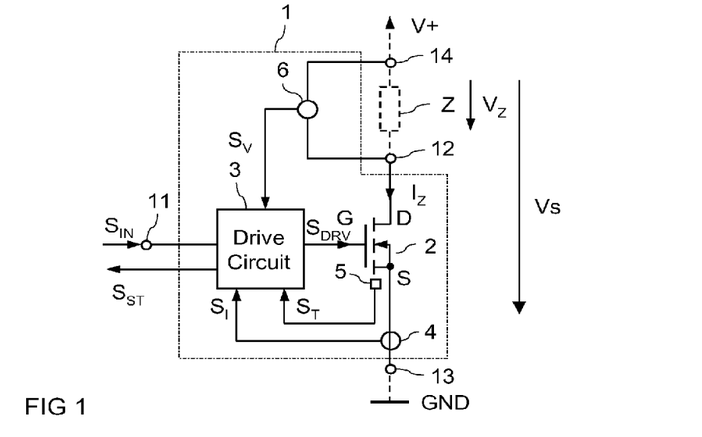
FIG. 1 illustrates an electronic circuit with an electronic switch and a drive circuit coupled to a control terminal of the electronic switch, according to one embodiment.

FIG. 1 schematically illustrates an electronic circuit 1 including an electronic switch 2 and a drive circuit 3 for the electronic switch 2. The electronic switch 2 has a load path that is configured to be connected in series with a load Z (illustrated in dashed lines in FIG. 1) and a control terminal, where the drive circuit 3 has a drive output coupled to the control terminal of the electronic switch 2. In the embodiment illustrated in FIG. 1, the electronic switch 2 is implemented as an MOS transistor, specifically as an n-type enhancement MOSFET. The MOSFET has drain and source terminals D, S, between which a drain-source path extends that forms a load path of the MOSFET. The MOSFET further includes a gate terminal G that forms the control terminal. It should be noted that implementing the electronic switch 2 as an n-type enhancement MOSFET is only an example. Any other type of MOSFET, such as a p-type enhancement MOSFET, an n-type or p-type depletion MOSFET, but also any other type of transistor, such as an IGBT or a bipolar junction transistor (BJT) may be used as well.

The drive circuit 3 is configured to receive an input signal $S_{IN}$ at a first terminal 11 and to drive the electronic switch 2 dependent on the input signal $S_{IN}$, dependent on a load current $I_Z$ through the electronic switch 2, dependent on a temperature T of the electronic switch 2, and dependent on a voltage $V_Z$ across a load Z connected in series with the electronic switch 2. In the embodiment illustrated, a series circuit with the electronic switch 2 and the load Z is connected between terminals 13 and 14. In the illustrated embodiment terminal 14 is for a positive supply potential V+ and, terminal 13 is for a negative supply potential or reference potential GND, respectively. Vs denotes a supply voltage available between the supply terminal. In the embodiment illustrated in FIG. 1, the electronic switch 2 is implemented as a low-side switch. "A low-side switch" is a switch connected between a load, such as the load Z of FIG. 1, and a negative supply potential or reference potential, such as reference potential GND of FIG. 1. However, this is only an example. The electronic switch 2 could also be implemented as a high-side switch, which is a switch connected between the load and a terminal for the positive supply potential.

Referring to FIG. 1, the electronic circuit 1 further includes a temperature sensor 5 that is thermally coupled to the electronic switch 2 and that generates a temperature signal $S_T$ that represents the temperature T of the electronic switch 2. The temperature sensor 5 can be implemented as a conventional temperature sensor that is thermally coupled to the electronic switch, in particular to a pn-junction of the electronic switch, and that is configured to measure a temperature of the electronic switch 2 and to generate a temperature signal $S_T$ that represents the temperature. The electronic circuit 1 further includes a current sensor 4 that is configured to measure the load current $I_Z$ through the electronic switch 2 and to provide a current signal $S_I$ that represents the load current $I_Z$. The current sensor 4 can be implemented as a conventional current sensor that is configured to measure the current through the electronic switch 2 and to provide the current signal $S_I$. Further, a voltage sensor 6 is configured to be connected to terminals 12, 14 of the load and to provide a voltage signal $S_V$ that represents the load voltage $V_Z$, which is the voltage across the load Z. The temperature signal $S_T$, the current signal $S_I$ and the voltage signal $S_V$ are each received by the drive circuit 3. The drive circuit 3 generates a drive signal $S_{DRV}$ that is suitable to drive the electronic switch 2 dependent on the input signal $S_{IN}$ and dependent on the other parameters explained above.

The input signal $S_{IN}$ generally defines a desired switching state of the electronic switch 2, namely an on-state, in which the electronic switch 2 is switched on, or an off-state, in which the electronic switch 2 is switched off. A signal level of the input signal $S_{IN}$ indicating a desired on-state of the electronic switch 2 will be referred to as on-level in the following, and a signal level of the input signal $S_{IN}$ indicating a desired off-state of the electronic switch 2 will be referred to as off-level in the following. While the drive circuit 3 always switches the electronic switch off, when the input signal $S_{IN}$ has an off-level, there may be load scenarios in which the drive circuit 3 at least temporarily overrides an on-level of the input signal $S_{IN}$ and switches the electronic switch off.

It is desired to use the electronic switch 2 for switching different types of loads Z, such as motors, actors, or lamps, specifically incandescent filament lamps. Incandescent filament lamps have a filament that is heated so as to glow and emit light, when a load current flows through. When, however, an incandescent filament lamp has been switched off for a long time, so that it is cold, the filament has a low resistance, so that immediately after switching on a high load current may occur.

The drive circuit 3 of FIG. 1 employs one of the methods explained herein below that enables the electronic switch to switch different types of loads and that protects the switch from being damaged or destroyed when there is a defect, such as a short-circuit, in the load.

Figure 2:
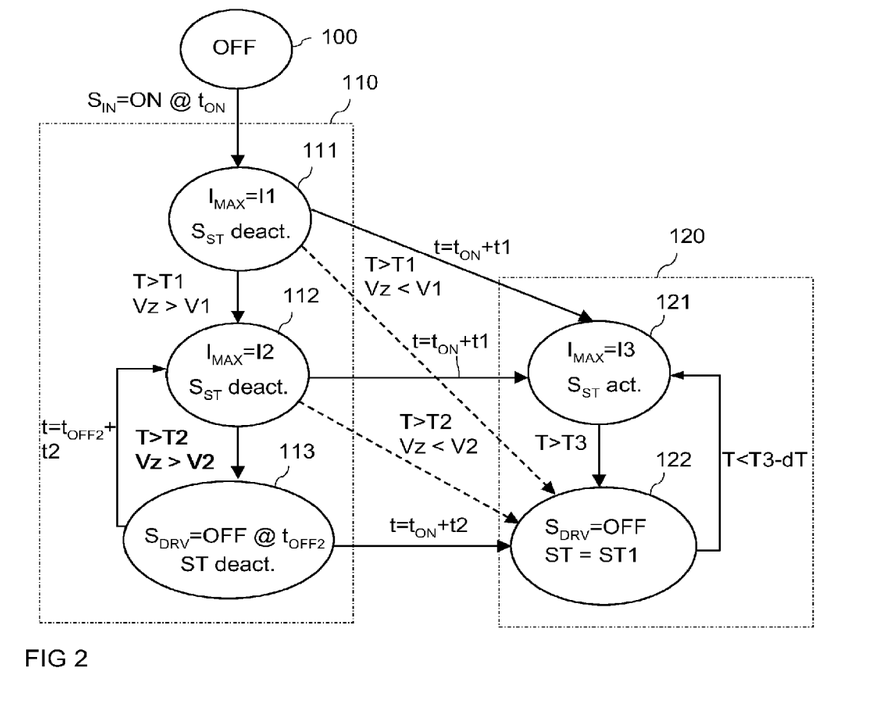
FIG. 2 illustrates a first embodiment of a method for driving the electronic switch.

The first embodiment of a method for driving the electronic switch 2 is illustrated in FIG. 2. FIG. 2 shows a state diagram that illustrates different operation states of the electronic switch and that illustrates conditions that cause transfers between the individual operation states.

The method will be explained starting with an off-state 100 in which the input signal $S_{IN}$ has an off-level and in which the electronic switch 2 is, therefore, switched off. For explanation purposes it is assumed that a time $t_{ON}$, that will be referred to as switch-on time, the signal level of the input signal $S_{IN}$ changes from the off-level to the on-level. At this time, the electronic circuit 1 enters a first operation mode 110, so that the switch is operated in the first operation mode. In the first operation mode 110, the electronic switch 2 is driven dependent on the load voltage $V_Z$ and dependent on the temperature T of the electronic switch 2. The electronic switch 2 is operated in the first operation mode 110 for a first time period t1 at most and is then operated in a second operation mode 120. In FIG. 2, the equation $t=t_{ON}+t1$ describes the condition that is met when there is a transfer from the first operation mode 110 to the second operation mode 120 at the expiration of the first time period, wherein t is a time variable. In the second operation mode 120 the electronic switch 2 is driven dependent on the temperature T in accordance with a hysteresis curve. According to one embodiment, the first time period t1 is between 50 ms and 500 ms, in particular between 100 ms and 300 ms.

Referring to FIG. 2, the first operation mode 110 includes a first current limiting mode 111, in which the electronic switch 2 is operated such that a load current $I_Z$ is limited to a first current limit I1. Operating the electronic switch 2 in a current limiting mode, such as the first current limiting mode 111 or other current limiting modes explained below, means that the electronic switch 2 is operated such that the load current through the electronic switch 2 does not rise above a defined current limiting, such as the first current limit in the first current limiting mode 111. In a current limiting mode two operation scenarios are possible. A first scenario in which the load current is below the current limit, and a second scenario in which the load current rises to the current limit. In the first scenario, the electronic switch 2 is "completely switched on" which means that the electronic switch is operated such that it has a minimum on-resistance, wherein the on-resistance is the ohmic resistance between the load terminals D,S. In the second scenario, the electronic switch is driven such that the on-resistance is higher than the minimum on-resistance and is such that the load current $I_Z$ is limited to the given current limit. In the following, operating the electronic switch 2 according to the first scenario will be referred to as operating the electronic switch in a low-ohmic state, and operating the electronic switch 2 according to the second scenario will be referred to as operating the electronic switch in a limiting state.

The on-resistance of the electronic switch 2, in order to drive the electronic switch 2 in the low-ohmic state or the limiting state can be adjusted through the drive signal $S_{DRV}$ received at its control terminal G. For explanation purposes it is assumed that the gate drive signal $S_{DRV}$ can be varied with a given drive signal range. In order to drive the electronic switch 2 in the low-ohmic state, a maximum value of the drive signal range can be applied to the drive terminal. For example, in an n-type enhancement MOSFET, the drive signal range may vary between 0 and $S_{DRV-MAX}$, where $S_{DRV-MAX}$ denotes the maximum. The maximum is dependent on the technology in which the MOSFET is implemented. In order to drive the electronic switch in the limiting state, the drive signal $S_{DRV}$ is reduced to a value below the maximum $S_{DRV-MAX}$ but above a threshold voltage at which the electronic switch switches off. To what value the drive signal $S_{DRV}$ is reduced is dependent on the desired on-resistance and the desired current limit, respectively. When the electronic switch is operated in the limiting state, more electrical energy is dissipated in the electronic switch 2 than in the low-ohmic state, so that a temperature of the electronic switch 2 may increase.

Thus, when the load current $I_Z$ is below the current limit, the electronic switch 2 is operated in the low-ohmic on-state, which is the on-state in which the on-resistance has a minimum. When the load current $I_Z$ increases to the current limit, the current limiting functionality sets in, in order to increase the on-resistance, so as to limit the load current $I_Z$ to the current limit.

When, in the first current limiting mode 111, the current increases to the first current limit I1 the electronic switch is operated in the limiting state in order to prevent a further increase of the load current $I_Z$. This, however, may cause the temperature T of the electronic switch 2 to increase. When in the first current limiting mode 111 the temperature rises above a first temperature threshold T1 and when the load voltage $V_Z$ is above a first voltage threshold V1 the electronic switch 2 is operated in a second current limiting mode 112 in which the electronic switch 2 is operated such that the load current $I_Z$ is limited to a second current limit I2 that is higher than the first current limit I1. In FIG. 2, $I_{MAX}$ denotes the maximum load current that is possible in the individual operation modes (operation states).

When in the second current limiting mode 112 the temperature T rises above a second temperature threshold T2 that is higher than the first temperature threshold T1, and when the load voltage $V_Z$ is above a second voltage threshold V2 that is higher than the first voltage threshold V1, the electronic switch 2 is switched off, although the input signal $S_{IN}$ may still have an on-level. The electronic switch 2 is switched off for a given second period t2 and after expiration of this second time period t2 is again operated in the second current limiting mode 112, when the input signal still has an on-level. In FIG. 2, $t_{OFF2}$ denotes the time when the electronic switch 2 is switched off in the second current limiting mode 112 (indicated by $S_{DRV}$=OFF @ $t_{OFF2}$ in FIG. 2), so that the electronic switch is operated in an off-state, that will be referred to as first temperature induced off-state in the following. The electronic circuit 1 leaves the first temperature induced off-state 113 after the second time period, which is when the condition $t=t_{OFF2}+t2$ is met, so that the electronic switch is again operated in the second current limiting mode 112. According to a further embodiment, the electronic circuit 1 leaves the first temperature induced off-state 113 whenever the temperature decreases to a temperature that corresponds to the second temperature threshold T2 minus a hysteresis value dT'. The hysteresis value dT' is, for example, a value between 10K and 20K.

The first operation mode 110 with the first current limiting mode 111 in the second current limiting mode 112 can be referred to as incandescent light start-up mode, because this first operation mode 110 helps to start-up an incandescent light connected as the load Z to the electronic switch 2. This will be explained in the following.

For explanation purposes it is assumed that an incandescent light as the load Z is connected in series with the electronic switch 2 and that the incandescent light is cold at the on-time $t_{ON}$ when the electronic switch 2 is switched on. When the incandescent light is cold it has a very low on-resistance, so that the load current $I_Z$, that is mainly dependent on the resistance of the load Z and the supply voltage, would be higher than the first current limit I1. The current through the electronic switch 2 is therefore limited to the first current limit I1 in the first current limiting mode 111 by operating the electronic switch 2 in the limiting state, so that electrical power is dissipated in the electronic switch 2, which causes the temperature T of the electronic switch 2 to increase. When the temperature rises above the first temperature threshold T1, and when the load voltage $V_Z$ is above the first voltage threshold V1, the load current $I_Z$ is allowed to increase to the second current limit I2 in the second current limiting mode 112. While already the (limited) load current $I_Z$ flowing through the incandescent lamp in the first current limiting mode heats the filament of the incandescent lamp, the higher current flowing in the second current limiting mode 112 increases the temperature of the filament even more.

However, the second current limiting mode 112 is only entered when there is a high probability that an incandescent lamp is connected to the electronic switch 2 and that the high load current $I_Z$ does not result from a fault in the load Z, such as, for example, a short circuit of the load Z. For this, the load voltage $V_Z$ is evaluated, where the second current limiting mode 112 is entered only when the load voltage $V_Z$ is above the first voltage threshold V1. The first voltage threshold V1 is selected to be higher than a voltage drop that may result from a load current $I_Z$ having an amplitude corresponding to the first current limit I1 flowing through a faulty load, such as a load having a short circuit.

When in the second current limiting mode 112 the temperature rises above the second temperature threshold T2 the electronic switch 2 is switched off and is again switched on after the second time period t2 when there is still a high probability that the load Z connected to the electronic switch 2 is an incandescent lamp. For this, again the load voltage $V_Z$ is evaluated, and the first temperature induced off-state 113 is only entered, when the load voltage $V_Z$ is above a second voltage threshold V2 that is higher than the first voltage threshold V1. This is based on the assumption that the filament of the incandescent lamp is heated when the electronic switch 2 is operated in the first and second current limiting modes 111, 112, so that its resistance increases and the load voltage $V_Z$ increases correspondingly. In order to be able to detect a temperature-induced increase of the electrical resistance of an incandescent lamp, and in order to be able to exclude that an increase of the load voltage $V_Z$ does only result from an increase of the load current $I_Z$ to the second current limit I2, a ratio V2:V1 between the second voltage threshold V2 and the first voltage threshold V1 is higher than a ratio I2:I1 between the second current limit I2 and the first current limit I1.

Switching off the electronic switch in the first temperature induced off-state 113 and again switching on after the given time period t2 helps to prevent the electronic switch 2 from being damaged by allowing the electronic switch 2 to cool down to a certain extent. In this connection it is assumed that the temperature of the electronic switch 2 decreases faster during the given time period t2 than a temperature of the filament of the lamp. Otherwise, switching off the electronic switch in the first temperature induced off-state 113 would be counterproductive in terms of heating the filament during the incandescent lamp start-up mode 110.

According to one embodiment, the first temperature threshold T1 is selected from between 125° C. and 175° C., and the second temperature threshold T2 is selected from between 175° C. and 225° C. According to one embodiment, the first current limit I1 is selected from between 0.8 A and 1.2 A, while the second current limit I2 is selected from between 1.3 A and 1.7 A. The first voltage threshold V1 is, for example, selected from between 0.2 times and 0.3 times the supply voltage Vs, while the second voltage threshold V2 is, for example, selected from a range of between 0.4 times and 0.6 times the supply voltage Vs.

The first operation mode 110 has a maximum duration that equals the first time period t1. Thus, latest at the expiration of the first time period t1 after the on-time $t_{ON}$, which is when the condition $t=t_{ON}+t1$ is met, there is a transition from the first operation mode 110 to the second operation mode 120. The first time period t1 is selected such that a cold incandescent lamp can be heated during the first time period t1 such that the resistance of the filament increases to a resistance value at which the load current in a normal operation of the incandescent lamp is below the first current limit I1. According to one embodiment, the first time period t1 is between 100 ms and 300 ms, in particular about 200 ms.

When, for example, a load Z is connected to the electronic switch 2 that is not an incandescent lamp and that does not cause the load current $I_Z$ to increase to the first current limit I1, then the electronic switch 2 is operated in the low-ohmic state in the first current limiting mode 111 until the first time period t1 expires and the second operation mode 120 is entered.

It should be noted, that even when an incandescent lamp is connected to the electronic switch 2, not each of the first and second current limiting modes 111, 112 and the first temperature induced off-state 113 are entered in the first operation mode 110. Which of the second current limiting mode 112 and the temperature induced off-state 113 is entered besides the first current limiting mode 111 is dependent on the specific type of lamp. It is possible that an incandescent lamp is connected to the electronic switch 2 and that the electronic switch 2 is only operated in the first current limiting mode 111, because the temperature does not rise above the first temperature threshold T1. It is also possible that the electronic switch 2 is first operated in the first current limiting mode 111 and then in the second current limiting mode 112, but that the temperature does not rise above the second temperature threshold T2, so that the electronic switch 2 is not switched off during the first operation mode 111 before the expiration of the first time period t1.

Optionally, the electronic switch 2 is operated in the second operation mode 120 already before the expiration of the first time period t1. This is illustrated in dashed lines in FIG. 2. In this embodiment, the electronic circuit 1 leaves the first operation mode 110 and enters the second operation mode 120 when in the first current limiting mode 111 the temperature T rises above the first temperature threshold T1 but when the load voltage $V_Z$ is below the first voltage threshold V1. In this case it is assumed that the load Z connected to the electronic switch 2 is not an incandescent lamp, so that the incandescent lamp start-up mode 110 is left. Equivalently, the electronic switch 2 leaves the incandescent start-up mode 110 when in the second current limiting mode 112 the temperature rises above the second temperature threshold T2, but when the load voltage $V_Z$ is below the second voltage threshold V2. In this case it is likely that there is a short-circuit in the load. When the load is a load other than an incandescent lamp (or a DC motor) and the load is faultless the second current limiting mode is usually not entered.

In the embodiment of the method explained so far with reference to FIG. 2, the absolute value of the load voltage $V_Z$ is evaluated in the first operation mode 110 in order to determine whether there is a high probability that an incandescent lamp is connected to the electronic switch 2. However, evaluating the absolute value $V_Z$ is only an example. According to a further embodiment, additionally or alternatively to evaluating the absolute value of the load voltage $V_Z$ a rate of change $dV_Z/dt$ of the load voltage $V_Z$ may be evaluated as well. According to a first embodiment, there is only a transition from the first current limiting mode 111 to the second current limiting mode 112 when the rate of change of the load voltage $V_Z$ is higher than a first value, and there is only a transition from the second current limiting mode 112 to the off-state 113 when the rate of change is higher than a second value, where the second value is higher than the first value. According to a first embodiment, the first value is selected from between Vs/140 per milliseconds (ms) and Vs/70 per milliseconds, where Vs is a typical supply voltage. According to one embodiment, the second value is selected from between Vs/70 per milliseconds and Vs/35 per milliseconds. These values, however, are only an example. Other values may of course be selected depending on the specific application.

According to one embodiment, only one of the absolute value of the load voltage $V_Z$ and the rate of change of the load voltage $V_Z$ is evaluated. According to a further embodiment, both, the value and the rate of change of the load voltage $V_Z$ are evaluated when in the first current limiting mode 111 the temperature rises above the first temperature threshold T1 and when in the second current limiting mode 112 the temperature T rises above the second temperature threshold T2. The transition from the first current limiting mode 111 to the second current limiting mode 112 occurs only when the absolute value and the rate of change of the load voltage $V_Z$ meet the conditions explained before, and a transition from the second current limiting mode 112 to the off-state 113 occurs only when the absolute value and the rate of change of the load voltage $V_Z$ meet the conditions explained before.

In the second operation mode 120, the electronic switch 2 is driven dependent on the temperature T according to a hysteresis curve. In this second operation mode 120 the electronic switch 2 is operated in a third current limiting mode 121 in which the load current is limited to a third current limit I3, where the electronic switch 2 is switched off and enters a second temperature induced off-state 122 each time the temperature T rises above a third temperature threshold T3. The electronic switch 2 is again switched on in the third current limiting mode 121 when the temperature T has fallen below the third temperature T minus a hysteresis value dT. According to one embodiment, the third temperature T3 is selected from between 140° C. and 160° C., and the hysteresis value dT is selected from between 10K and 20K.

It should be noted that dependent on the load Z connected to the electronic switch 2 the electronic switch 2 when operated in the second operation mode 120 may never enter the second temperature induced off-state 122. When the load current $I_Z$ is always below the third current limit I3, so that the load current $I_Z$ does not have to be limited in the third current limiting mode 121, there is no increase of the temperature of the electronic switch 2 to the third temperature threshold T3 and no temperature induced switching off may occur. According to one embodiment, the third current limit I3 equals the first current limit I1.

According to one embodiment, drive circuit 3 is configured to generate a status signal $S_{ST}$. The status signal $S_{ST}$ is, for example, configured to indicate when the electronic switch is operated in the limiting state and/or when there is a temperature induced switching off of the electronic switch 2. According to one embodiment, generation of the status signal $S_{ST}$ is deactivated in the first operation mode 110 although in the first operation mode 110 operation scenarios may occur in which the electronic switch is operated in the limiting state or in which there is a temperature induced switching off of the electronic switch 2. However, in the first operation mode 110 operating the electronic switch in the limiting state and/or temperature induced switching off of the electronic switch 2 is considered as a normal operation that is required for an incandescent lamp connected to the electronic switch 2 to properly start up.

In the second operation mode 120, however, an increase of the load current $I_Z$ to the third current limit I3, so that the electronic switch 2 is operated in the limiting state in order to limit the load current $I_Z$ to this third current limit I3 and/or a temperature induced switching off the electronic switch 2 is not considered as a normal operation. Thus, generation of the status signal $S_{ST}$ is activated in the second operation mode 120, so that the status signal $S_{ST}$ indicates when in the third current limiting mode 121 the current limiting mechanism sets in and/or when there is a temperature induced switching off of the electronic switch 2 in the second temperature induced off-state.

In the first operation mode 110 as well as in the second operation mode 120 the input signal $S_{IN}$ has an on-level. Switching off the electronic switch 2 in the first and second operation mode 110, 120 is, therefore, only temperature induced. Whenever the input signal $S_{IN}$ changes the signal level from the on-level to the off-level, the electronic switch 2 is switched off and the electronic circuit 1 returns to the off-state 100. The transition to the off-state dependent on the input signal $S_{IN}$ can occur from any of the operation states illustrated in FIG. 2, so that for the ease of illustration these transitions are not illustrated in FIG. 2.

Figure 3:
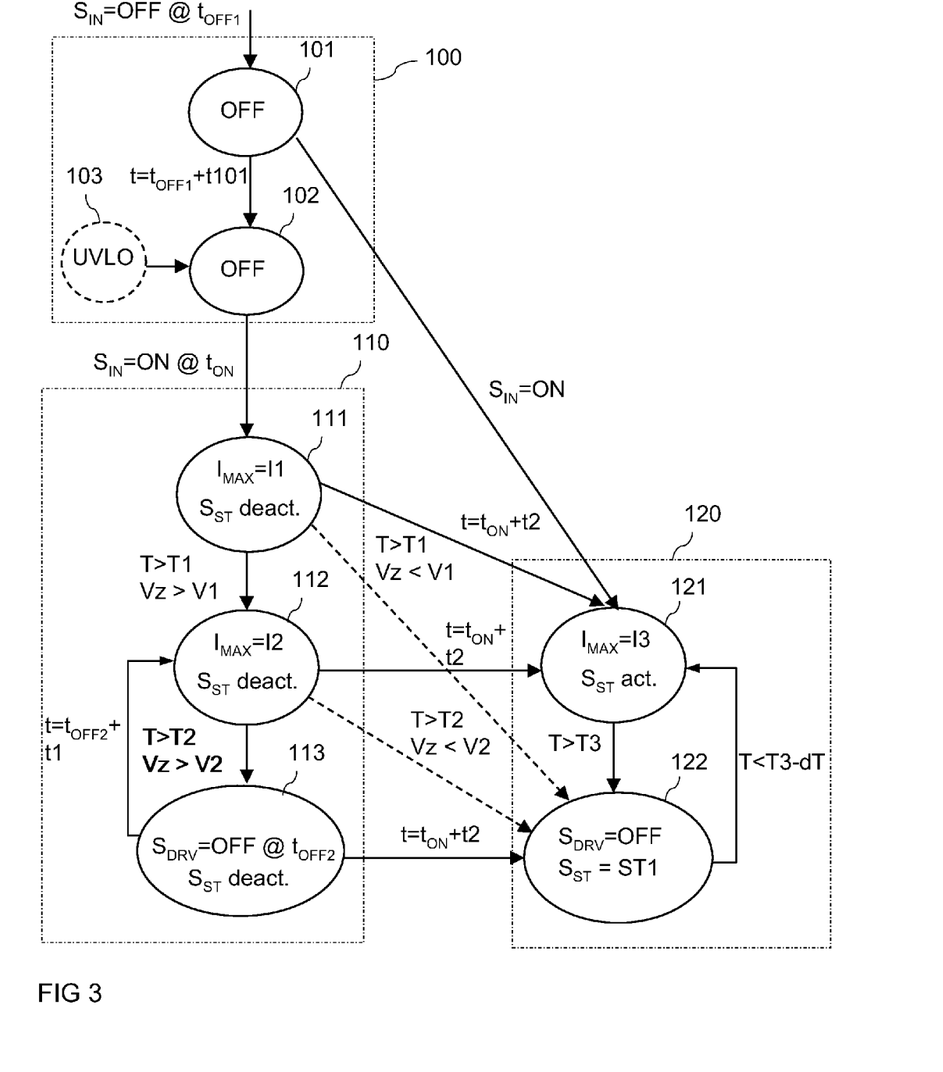
FIG. 3 illustrates a second embodiment of a method for driving an electronic switch, which is a modification of the method illustrated in FIG. 2.

FIG. 3 illustrates a further embodiment of a method for driving the electronic switch 2. The method according to FIG. 3 is based on the method according to FIG. 2, wherein in the method according to FIG. 3 there may be operation scenarios in which the electronic circuit 1 transitions from the off-state 100 to the second operation mode 120 instead of the first operation mode 110. In this method, a duration of the off-level of the input signal $S_{IN}$ is evaluated before the on-time $t_{ON}$ (at which the input signal $S_{IN}$ changes its signal level from the off-level to the on-level). When this duration of the off-level is shorter than a given first off-period t101 and the input signal $S_{IN}$ changes to the on-level (illustrated as $S_{IN}$=ON in FIG. 3) the electronic switch 2 is immediately operated in the second operation mode 120. When, however, the duration of the off-level is longer than the first off-period t101 and the signal level of the input signal $S_{IN}$ changes to the on-level, the electronic switch 2 is first operated in the second operation mode 120.

In the state diagram illustrated in FIG. 3, the off-state 100 includes two sub-states, namely a first sub-state 101 which governs the operation of the electronic switch 2 between the time $t_{OFF1}$ at which the input signal $S_{IN}$ assumes the off-level and the expiration of the first off-period t101, and a second sub-state 102 which governs the operation of the electronic switch 2 between the expiration of the first off-period t101 and the on-time $t_{ON}$. From the first sub-state 101 there is a transition to the second operation mode 120, in particular to the third current limiting state 121, and from the second sub-state 102 there is a transition to the first operation mode 110, in particular to the first current limiting mode 111.

According to one embodiment, the electronic circuit 1 has a functionality to monitor the supply voltage Vs and to enter an undervoltage lockout (UVLO) state 103 when the supply voltage Vs falls below a given supply voltage threshold. When the supply voltage Vs subsequently rises above this threshold, the electronic circuit 1 enters the second sub-state 102, from which there is only a transition to the first operation mode 110 possible.

The motivation of directly entering the second operation mode 120 when the electronic switch 2 has not been switched off longer than the given first off-period t101 is as follows. Even when an incandescent lamp is connected to the electronic switch 2 that has been switched less than the first off-period t101 before, this first off-period t101 is too short for the incandescent lamp, specifically for the filament, to significantly cool down, so that the incandescent lamp can be considered to be hot and can, therefore, be operated in the second operation mode 120. The given first off-period t101 is therefore chosen according to the time period an incandescent lamp needs to cool down and is, for example, between 300 ms and 1 s.

Figure 4:
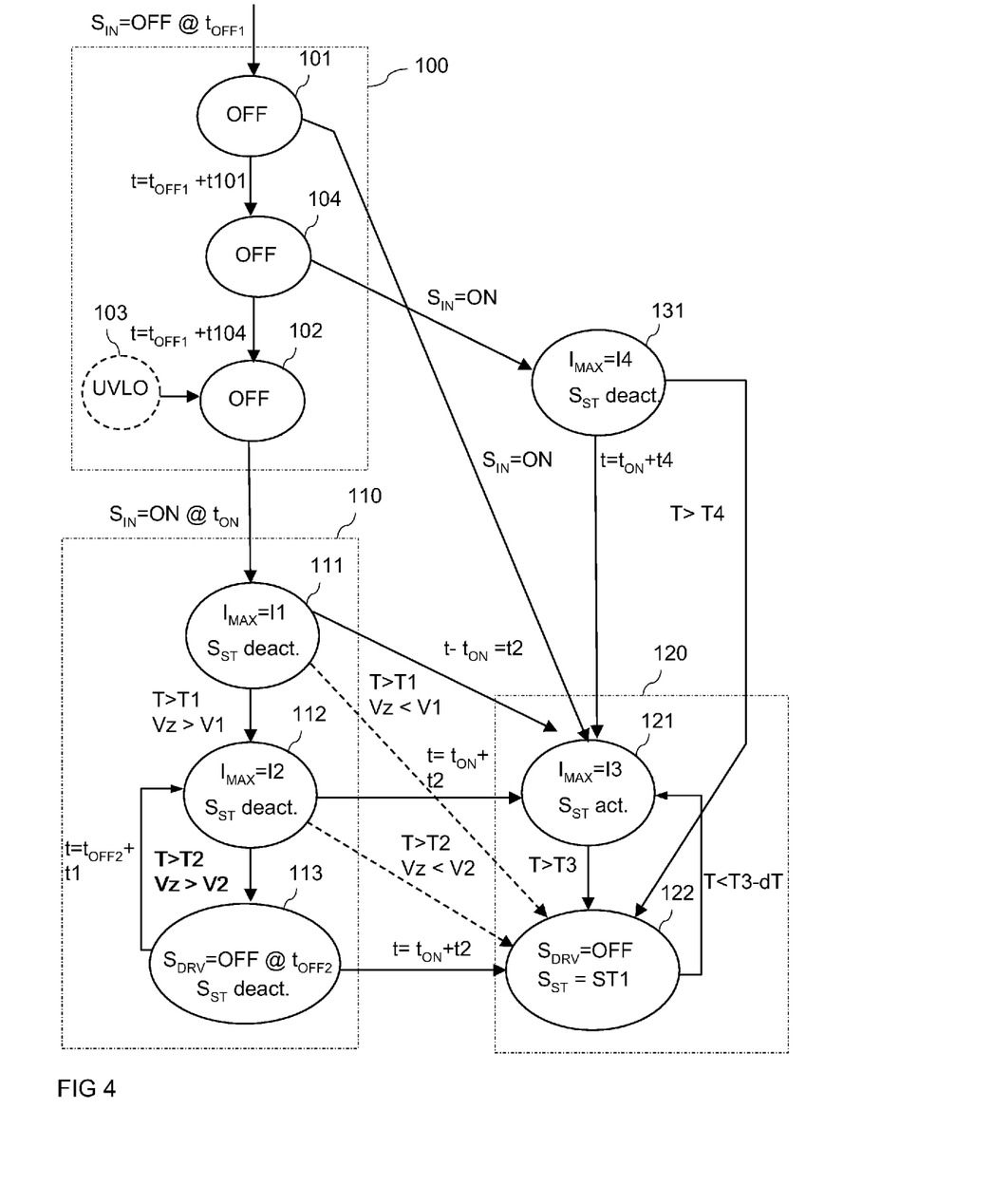
FIG. 4 illustrates a third embodiment of a method for driving an electronic switch, which is a modification of the method illustrated in FIG. 3.

FIG. 4 illustrates a further embodiment of the method for driving the electronic switch 2. This method is based on the method according to FIG. 3. In this method, the off-state 100 has a third sub-state 104 that is entered at the expiration of the first off-period t101, and the second sub-state is entered at the expiration of a second off-state t104 that is longer than the first off-state t101. According to one embodiment, the second off-period t104 is between 1 second and 3 seconds. When the input signal assumes an on-level before the expiration of the first off-period, which is when the electronic circuit 1 is in the third sub-state 104, the electronic circuit 1 enters a fourth current limiting mode 131 in which the load current $I_Z$ is limited to a fourth current limit I4. The fourth current limit I4 may correspond to the third current limit I3, so that operating the electronic switch 2 in the fourth current limiting mode 131 equals the operation of the electronic switch 2 in the third current limiting mode 121 with the difference that in the fourth current limiting mode 131 generation of the status signal $S_{ST}$ is deactivated. From the fourth current limiting mode 131 the electronic circuit 1 transitions to the third current limiting mode 121 after a given time period t4 which is, for example, between 150 ms and 250 ms, or the thermally induced second off-state 122 when the temperature T rises above a fourth temperature threshold T4 which may correspond to the third temperature threshold T3.

Operating the electronic switch 2 in the fourth current limiting mode 131 is equivalent to operating the electronic switch 2 in the third current limiting mode 121, with the difference, that generation of the status signal $S_{ST}$ is suppressed for the given time period t4. Thus, activation of the current limiting mechanism will not be reported through the status signal $S_{ST}$ during the fourth time period t4. It can be assumed that a current limiting that is required no longer than the fourth time period t4 may result from a start-up scenario of certain types of loads, such as DC motors or flashing lamps, where the filament cools only partly down during the off period.

Figure 5:
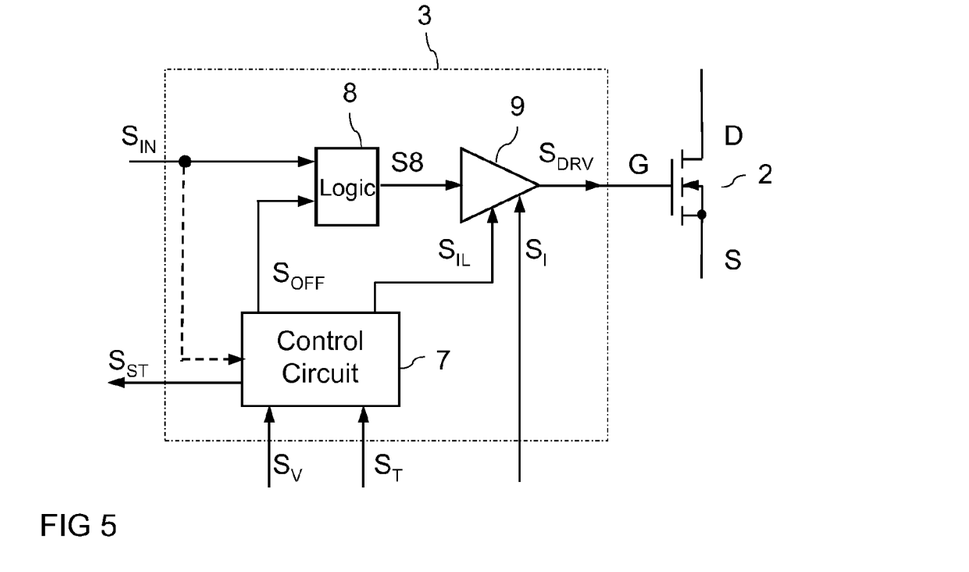
FIG. 5 schematically illustrates an embodiment of the drive circuit.

FIG. 5 schematically illustrates an embodiment of the drive circuit 3. The drive circuit 3 includes a control circuit 7 that receives the voltage signal $S_V$ and the temperature signal $S_T$ and that generates an off-signal $S_{OFF}$, a current limit signal $S_{IL}$ and the status signal $S_{ST}$. A logic gate 8 receives the input signal $S_{IN}$ and the off-signal $S_{OFF}$ and generates a logic signal S8 that is dependent on the input signal $S_{IN}$ and the off-signal $S_{OFF}$. A driver 9 receives the logic signal S8 and generates the drive signal $S_{DRV}$ dependent on the current signal $S_I$ and the current limit signal $S_{IL}$. The logic signal S8 may assume an on-level or an off-level, wherein the driver 9 is configured to switch the electronic switch 2 on, when the logic signal S8 assumes an on-level and is configured to switch the electronic switch 2 off when the logic signal S8 assumes an off-level. The off-signal $S_{OFF}$ can assume an off-level, wherein the control circuit 7 generates an off-level of this signal $S_{OFF}$ each time when a temperature induced switching off of the electronic switch 2 is required, which is in the first and second temperature induced operation states 113 and 122 according to FIGS. 2 to 5. The logic gate 8 is configured to generate an off-level of the logic signal S8 whenever the off-signal $S_{OFF}$ has an off-level, independent of the signal level of the input signal $S_{IN}$. According to one embodiment, on-levels of the input signal $S_{IN}$ and the logic signal S8 are high-levels, while an off-level of the off-signal $S_{OFF}$ is a low-level. In this embodiment, the logic gate 8 is, for example, implemented as an AND-gate.

The control circuit 7 may also receive the input signal $S_{IN}$ in order to evaluate the off-time of the input signal $S_{IN}$ and in order to transfer the electronic switch into the off-state 100, when the input signal $S_{IN}$ assumes the off-level.

The current limiting signal $S_{IL}$ defines the current limit to which the load current $I_Z$ through the electronic switch is limited by the driver 9. This current limit is selected by the control circuit 7 dependent on the specific operation state, in particular dependent on the specific current limiting mode in which the electronic switch 2 is to be operated.

Figure 6:
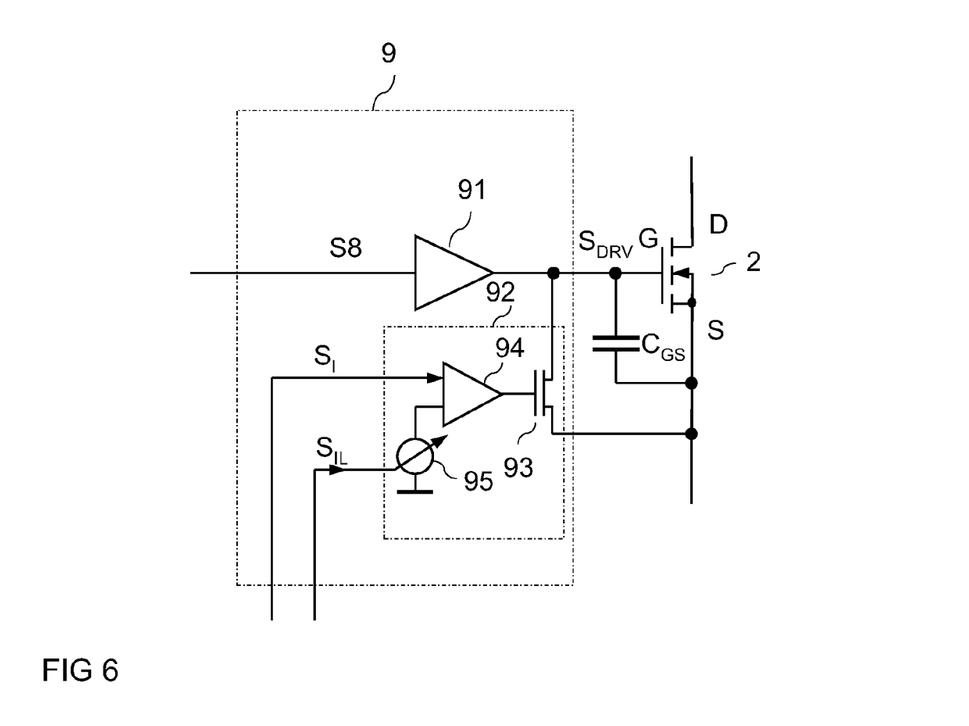
FIG. 6 schematically illustrates an embodiment of a driver implemented in the drive circuit.

An embodiment of a driver 9 with a current limiting circuit is illustrated in FIG. 6. The driver 9 according to FIG. 6 includes a first drive unit 91 that can be implemented as a conventional driver unit for driving an electronic switch 2, such as an MOSFET, dependent on a logic signal S8. The electronic switch 2 implemented as a MOSFET illustrated in FIG. 6 is a voltage controlled device that has an on-resistance which is dependent on a gate-source voltage. This gate-source-voltage is defined by the charging state of an internal gate-source capacitance $C_{GS}$ which is also illustrated in FIG. 6. In order to adjust the control voltage, the current limiting circuit 92 includes a variable resistor 93, such as a transistor. The variable resistor 93 is connected between the gate and source terminals and is controlled dependent on the current signal $S_I$ and the current limit signal $S_{IL}$. The current limit signal $S_{IL}$ controls a reference signal source 95, such as a reference voltage source. A reference signal provided by the reference signal source 95 and the current signal $S_I$ are received by a controller 94 that may include an amplifier. This controller 94 drives the variable resistor 93 dependent on the current signal $S_I$ and the current limit signal $S_{IL}$ such that the on-resistance of the electronic switch 2 is adjusted such that the load current $I_Z$ is limited to a current limit as defined by the current limit signal $S_{IL}$.

It should be noted that when the load current $I_Z$ is below the current limit as defined by the current limit signal $S_{IL}$ the current limiting circuit 92 is deactivated, which is equivalent to the variable resistor 93 having a high resistance. In this case, the electronic switch 2 has its minimum on-resistance. When, however, the load current $I_Z$ rises to the current limit, the resistance of the variable resistor 93 is reduced in order to reduce the gate-source-voltage of the electronic switch 2, so that the on-resistance of the electronic switch 2 is increased in order to prevent an increase of the load current $I_Z$ above the current limit. In this operation state, however, electrical power is dissipated in the electronic switch 2, which may result in an increase of the temperature of the electronic switch 2.

According to a further embodiment, evaluating the load voltage $V_Z$ in the first operation mode 110 is optional as well as operating the electronic switch in the first and second current limiting modes 111, 112. In this case, the electronic circuit 1 enters the temperature induced off-state each time the temperature of the electronic switch 2 reaches a temperature corresponding to the second temperature T2 explained before. The electronic circuit 1 leaves the temperature induced off-state 113 either after a given time period corresponding to the time period $t_{OFF2}$ explained before, or after the temperature has decreased to a temperature corresponding to the temperature T2 minus the hysteresis value dT explained before. An on-state of the electronic circuit 1 enters after leaving the temperature induced off-state 113 can be a current limiting state, such as one of the first and second current limiting states 111, 112. The electronic circuit 1 leaves the first operation state 110 after the given time period t2 or when one of the conditions explained herein before are met. In the second operation mode 120 the electronic switch 2 is switched off each time the temperature of the electronic switch reaches a temperature that corresponds to the temperature T3 explained before, and that is lower than the temperature T2 at which the electronic switch is switched off in the first operation mode 110.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for driving an electronic switch connected in series with a load, the method comprising:
   operating the electronic switch in a first operation mode for a first time period, wherein the first time period comprises a time period that starts from when a signal level of an input signal has changed from an off-level to an on-level and ends after an expiration of a first predetermined delay time after the first time period starts, wherein operating the electronic switch in the first operation mode comprises driving the electronic switch dependent on a voltage across the load and dependent on a temperature of the electronic switch; and
   operating the electronic switch in a second operation mode after the first time period ends, wherein operating the electronic switch in the second operation mode comprises driving the electronic switch dependent on the temperature according to a hysteresis curve.

2. The method of claim 1, wherein operating the electronic switch in the first operation mode comprises operating the electronic switch in a first current limiting mode in which current through the electronic switch is limited to a first current limit.

3. The method of claim 1, further comprising:
   operating the electronic switch in the second operation mode before the end of the first time period when the temperature rises above a given temperature threshold but the load voltage does not meet a condition associated with an increase of the temperature above the given temperature threshold.

4. The method of claim 1, wherein operating the electronic switch in the second operation mode comprises:
   driving the electronic switch in a third current limiting mode in which the current through the electronic switch is limited to a third current limit; and
   switching the electronic switch off when in the third current limiting mode the temperature rises above a third temperature threshold until the temperature decreases to a temperature that is below the third temperature threshold.

5. The method of claim 4, wherein operating the electronic switch in the first operation mode comprises operating the electronic switch in a first current limiting mode in which current through the electronic switch is limited to a first current limit, wherein the third current limit equals the first current limit.

6. The method of claim 4, further comprising:
   when a current through the load reaches the third current limit, generating a status signal indicating that the third current limit has been reached, and
   when the electronic switch is switched off when in the second operation mode the temperature rises above the third temperature threshold, generating a status signal indicating that the electronic switch has been switched off.

7. The method of claim 1, further comprising:
   evaluating a duration of the off-level of the input signal before the on-level;
   operating the electronic switch in the first operation mode, when the duration of the off-level has been longer than a first off-period; and
   operating the electronic switch in the second operation mode, when the duration of the off-level has been shorter than a second off-period that is shorter than the first off period.

8. The method of claim 7,
   wherein the first off period is between 1 second and 3 seconds, and
   wherein the second off period is between 0.3 seconds and 1 second.

9. The method of claim 7, further comprising:
   operating the electronic switch in a fourth current limiting mode in which a current through the load is limited to a fourth current limit when the duration of the off-level has been longer than the second off-period but shorter than the first off-period.

10. The method of claim 1, wherein the first predetermined delay time is between 50 ms and 500 ms.

11. The method of claim 1 wherein the electronic switch comprises a transistor.

12. A method for driving an electronic switch connected in series with a load, the method comprising:
   operating the electronic switch in a first operation mode for a first time period after a signal level of an input signal has changed from an off-level to an on-level, wherein operating the electronic switch in the first operation mode comprises driving the electronic switch dependent on a voltage across the load and dependent on a temperature of the electronic switch;
   operating the electronic switch in a second operation mode after the first time period, wherein operating the electronic switch in the second operation mode comprises driving the electronic switch dependent on the temperature according to a hysteresis curve;
   wherein operating the electronic switch in the first operation mode comprises operating the electronic switch in a first current limiting mode in which current through the electronic switch is limited to a first current limit; and
   wherein operating the electronic switch in the first operation mode further comprises operating the electronic switch in a second current limiting mode in which the current through the electronic switch is limited to a second current limit higher than the first current limit, when in the first current limiting mode, the temperature rises above a first temperature threshold and the voltage across the load meets a first condition.

13. The method of claim 12, wherein operating the electronic switch in the first operation mode further comprises switching the electronic switch off when the temperature rises above a second temperature threshold higher than the first temperature threshold and when the voltage across the load meets a second condition different from the first condition.

14. The method of claim 13, wherein the first temperature threshold is between 125° C. and 175° C. and wherein the second temperature threshold is between 175° and 225° C.

15. The method of claim 13,
wherein the voltage across the load meets the first condition when the voltage across the load is above a first voltage threshold and/or when an increase of the voltage across the load over time is above a first voltage increase threshold; and
wherein the voltage across the load meets the second condition when the voltage across the load is above a second voltage threshold that is higher than the first voltage threshold and/or when an increase of the voltage across the load over time is above a second voltage increase threshold that is higher than the second voltage increase threshold.

16. The method of claim 15,
wherein the voltage across the load meets the first condition when the voltage across the load is above the first voltage threshold;
wherein the voltage across the load meets the second condition when the voltage across the load is above the second voltage threshold; and
wherein the second voltage threshold is at least 2 times the first voltage threshold.

17. The method of claim 15,
wherein the voltage across the load meets the first condition when the increase of the voltage across the load over time is above the first voltage increase threshold;
wherein the voltage across the load meets the second condition when the increase of the voltage across the load over time is above the second voltage increase threshold; and
wherein the second voltage increase threshold is at least 2 times the first voltage increase threshold.

18. The method of claim 15, further comprising applying a supply voltage to a series circuit that includes the electronic switch and the load;
wherein the voltage across the load meets the first condition when the voltage across the load is above the first voltage threshold;
wherein the voltage across the load meets the second condition when the voltage across the load is above the second voltage threshold;
wherein the first voltage threshold is between 0.15 times and 0.3 times the supply voltage; and
wherein the second voltage threshold is between 0.3 times and 0.6 times the supply voltage.

19. The method of claim 15, further comprising applying a supply voltage to a series circuit that includes the electronic switch and the load;
wherein the voltage across the load meets the first condition when the increase of the voltage across the load over time is above the first voltage increase threshold;
wherein the voltage across the load meets the second condition when the increase of the voltage across the load over time is above the second voltage increase threshold;
wherein the first voltage increase threshold is selected from a range of between 1/140*Vs per millisecond and 1/70*Vs per millisecond, wherein Vs is a supply voltage; and
wherein the second voltage increase threshold is selected from a range of between 1/70*Vs per millisecond and 1/35*Vs per millisecond.

20. The method of claim 15,
wherein the voltage across the load meets the first condition when the voltage across the load is above the first voltage threshold;
wherein the voltage across the load meets the second condition when the voltage across the load is above the second voltage threshold; and
wherein a ratio between the second voltage threshold and the first voltage threshold is higher than a ratio between the second current limit and the first current limit.

21. The method of claim 13, further comprising switching the electronic switch off for a given time period when the temperature rises above a second temperature threshold that is higher than the first temperature threshold, and driving the electronic switch in the first current limiting after the given time period.

22. The method of claim 13, further comprising:
operating the electronic switch in the second operation mode before the end of the first time period
when the temperature in the first current limiting mode rises above the first temperature threshold and the load voltage does not meet the first condition, or
when the temperature in the second current limiting mode rises above the second temperature threshold and the load voltage does not meet the second condition.

23. The method of claim 12, wherein the voltage across the load meets the first condition when the voltage across the load is above a first voltage threshold and/or when an increase of the voltage across the load over time is above a first voltage increase threshold.

24. A method for driving an electronic switch connected in series with a load, the method comprising:
operating the electronic switch in a first operation mode for a first time period after a signal level of an input signal has changed from an off-level to an on-level, wherein operating the electronic switch in the first operation mode comprises
switching the electronic switch off when a temperature of the electronic switch reaches a first temperature threshold,
operating the electronic switch in a first current limiting mode in which the current through the electronic switch is limited to a first current limit, and
operating the electronic switch in a second current limiting mode in which the current through the electronic switch is limited to a second current limit, the second current limit different from the first current limit; and
operating the electronic switch in a second operation mode after the first time period, wherein operating the electronic switch in the second operation mode comprises driving the electronic switch dependent on the temperature according to a hysteresis curve, wherein the electronic switch is switched off when the temperature of the electronic switch reaches a second temperature threshold that is lower than the first temperature threshold, and operating the electronic switch in the first operation mode further comprises operating the electronic switch in the second current limiting mode in which the current through the electronic switch is limited to a second current limit that is higher than the first current limit, when in the first current limiting mode, the temperature rises above a third temperature threshold and a load voltage meets a first condition.

25. The method of claim 24, wherein operating the electronic switch in the first operating mode further comprises switching the electronic switch off for a given time period when the temperature of the electronic switch reaches the first temperature threshold.

26. The method of claim 24, wherein operating the electronic switch in the second operating mode further comprises, after the electronic switch has been switched off, again switching the electronic switch on when the temperature of the electronic switch reaches a third temperature that corresponds to a second temperature minus a given hysteresis value.

27. The method of claim 24, further comprising:
operating the electronic switch in the second operation mode before the end of the first time period when the temperature rises above a given temperature threshold but a load voltage does not meet a condition associated with an increase of the temperature above the given temperature threshold.

28. An electronic circuit comprising:
an electronic switch comprising a control terminal and a load path configured to have a load connected thereto; and
a drive circuit coupled to the control terminal of the electronic switch, the drive circuit configured to receive an input signal and configured to
operate the electronic switch in a first operation mode for a first time period, wherein the first time period comprises a time period that starts from when a signal level of the input signal has changed from an off-level to an on-level and ends after an expiration of a first predetermined delay time after the first time period starts, wherein the first operation mode comprises driving the electronic switch dependent on a voltage across the load and dependent on a temperature of the electronic switch; and
operate the electronic switch in a second operation mode after the first time period ends, wherein the second operation mode comprises driving the electronic switch dependent on the temperature according to a hysteresis curve.

29. The electronic circuit of claim 28, wherein the drive circuit in the first operation mode is configured to operate the electronic switch in a first current limiting mode in which the current through the electronic switch is limited to a first current limit.

30. The electronic circuit of claim 28, wherein the drive circuit is further configured
to operate the electronic switch in the second operation mode before the end of the first time period when the temperature rises above a given temperature threshold but a load voltage does not meet a condition associated with an increase of the temperature above the given temperature threshold.

31. The electronic circuit of claim 28 wherein the drive circuit is further configured in the second operation mode
to drive the electronic switch in a third current limiting mode in which current through the electronic switch is limited to a third current limit; and
to switch the electronic switch off when in the third current limiting mode the temperature rises above a third temperature threshold until the temperature decreases to a temperature that is below the third temperature threshold.

32. The electronic circuit of claim 31, wherein the drive circuit is further configured
to generate a status signal indicating that the third current limit has been reached when a load current reaches the third current limit, and to generate a status signal indicating that the electronic switch has been switched off when the electronic switch is switched off when in the second operation mode the temperature rises above the third temperature threshold.

33. An electronic circuit comprising:
an electronic switch comprising a control terminal and a load path configured to have a load connected thereto; and
a drive circuit coupled to the control terminal of the electronic switch, the drive circuit configured to receive an input signal and configured to
operate the electronic switch in a first operation mode for a first time period after a signal level of the input signal has changed from an off-level to an on-level, wherein the first operation mode comprises driving the electronic switch dependent on a voltage across the load and dependent on a temperature of the electronic switch; and
operate the electronic switch in a second operation mode after the first time period, wherein the second operation mode comprises driving the electronic switch dependent on the temperature according to a hysteresis curve,
wherein the drive circuit in the first operation mode is configured to operate the electronic switch in a first current limiting mode in which the current through the electronic switch is limited to a first current limit, and
wherein the drive circuit in the first operation mode is further configured to operate the electronic switch in a second current limiting mode in which current through the electronic switch is limited to a second current limit higher than the first current limit, when in the first current limiting mode, the temperature rises above a first temperature threshold and a load voltage meets a first condition.

34. The electronic circuit of claim 33, wherein the drive circuit in the first operation mode is further configured to switch the electronic switch off when the temperature rises above a second temperature threshold that is higher than the first temperature threshold and when the load voltage meets a second condition different from the first condition.

35. The electronic circuit of claim 34, wherein the drive circuit is further configured
to operate the electronic switch in the second operation mode before the end of the first time period
when the temperature in the first current limiting mode rises above the first temperature threshold and the load voltage does not meet the first condition, or
when the temperature in the second current limiting mode rises above the second temperature threshold and the load voltage does not meet the second condition.

36. The electronic circuit of claim 33, wherein the load voltage meets the first condition when the load voltage is above a first voltage threshold and/or an increase of the load voltage over time is above a first voltage increase threshold.

37. The electronic circuit of claim 36, wherein the load voltage meets a second condition when the load voltage is above a second voltage threshold that is higher than the first voltage threshold and/or an increase of the load voltage over time is above a second voltage increase threshold higher than the first voltage increase threshold.

38. The electronic circuit of claim 37 further comprising a supply voltage source configured to provide a supply voltage to a series circuit with the electronic switch and the load,
wherein the first voltage threshold is selected from a range of between 0.15 times and 0.3 times the supply voltage and wherein the second voltage threshold is selected from a range of between 0.3 times and 0.6 times the supply voltage.

39. The electronic circuit of claim 37, wherein a ratio between the second voltage threshold and the first voltage threshold is higher than a ratio between the second current limit and the first current limit.

40. The electronic circuit of claim 33, wherein the drive circuit is further configured
- to switch the electronic switch off for a given time period when the temperature rises above a second temperature threshold higher than the first temperature threshold, and
- to drive the electronic switch in the first current limit after the given time period.

41. An electronic circuit comprising:
- an electronic switch comprising a load path configured to have a load connected thereto and a control terminal; and
- a drive circuit coupled to the control terminal of the electronic switch, the drive circuit configured to receive an input signal and configured to
  - operate the electronic switch in a first operation mode for a first time period after a signal level of the input signal has changed from an off-level to an on-level, wherein the first operation mode comprises switching the electronic switch off when a temperature of the electronic switch reaches a first temperature threshold, wherein the drive circuit is further configured in the first operation mode to
    - operate the electronic switch in a first current limiting mode in which current through the electronic switch is limited to a first current limit, and
    - operate the electronic switch in a second current limiting mode in which current through the electronic switch is limited to a second current limit different from the first current limit; and
  - operating the electronic switch in a second operation mode after the first time period, wherein the second operation mode comprises driving the electronic switch dependent on the temperature according to a hysteresis curve, wherein the electronic switch is switched off when the temperature of the electronic switch reaches a second temperature threshold lower than the first temperature threshold, and the drive circuit is further configured in the first operation mode to operate the electronic switch in the second current limiting mode in which current through the electronic switch is limited to a second current limit higher than the first current limit, when in the first current limiting mode, the temperature rises above a third temperature threshold and a load voltage meets a first condition.

42. The electronic circuit of claim 41, wherein the drive circuit is further configured in the first operation mode to switch the electronic switch off for a given time period when the temperature of the electronic switch reaches the first temperature threshold.

43. The electronic circuit of claim 41, wherein the drive circuit is further configured in the second operation mode to again switch the electronic switch on when the temperature of the electronic switch reaches a third temperature that corresponds to a second temperature minus a given hysteresis value.

44. The electronic circuit of claim 41 wherein the drive circuit is further configured to operate the electronic switch in the second operation mode before the end of the first time period when the temperature rises above a given temperature threshold but a load voltage does not meet a condition associated with an increase of the temperature above the given temperature threshold.

\* \* \* \* \*